Figure 1:
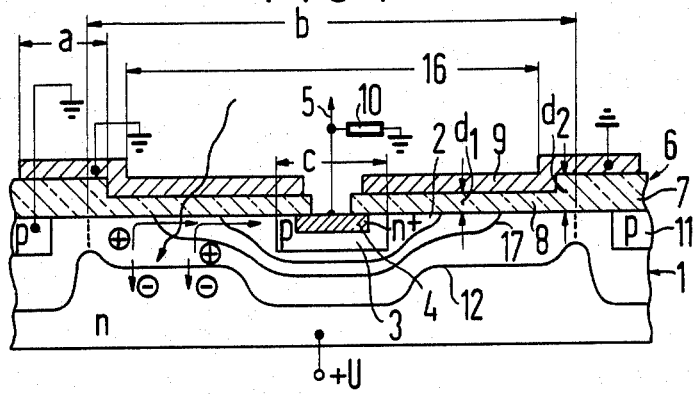

United States Patent [19]

Baumgartner et al.

[11] Patent Number: 4,524,375

[45] Date of Patent: Jun. 18, 1985

[54] PHOTO TRANSISTOR

[75] Inventors: Werner Baumgartner; Dieter Krockow; Jenö Tihanyi, all of Munich, Fed. Rep. of Germany

[73] Assignee: Siemens Aktiengesellschaft, Berlin and Munich, Fed. Rep. of Germany

[21] Appl. No.: 598,355

[22] Filed: Apr. 10, 1984

Related U.S. Application Data

[63] Continuation of Ser. No. 315,293, Oct. 27, 1981, abandoned.

[30] Foreign Application Priority Data

Nov. 25, 1980 [DE] Fed. Rep. of Germany ....... 3044341

[51] Int. Cl.³ .................. H01L 27/14; H01L 31/00; H01L 29/72; H01L 29/04
[52] U.S. Cl. .................................. 357/30; 357/34; 357/59; 357/86; 357/53
[58] Field of Search .................... 357/86, 38

[56] References Cited

U.S. PATENT DOCUMENTS

| | | | |
|---|---|---|---|
| 3,204,160 | 8/1965 | Sah | 357/38 |
| 3,518,494 | 6/1970 | James | 357/30 |
| 3,663,869 | 5/1972 | Strull | 357/30 |
| 4,107,721 | 8/1978 | Miller | 357/30 |
| 4,223,330 | 9/1980 | Koike et al. | 357/30 |
| 4,315,271 | 2/1982 | Roger | 357/86 |
| 4,318,115 | 3/1982 | Yoshikawa et al. | 357/30 |
| 4,321,486 | 3/1982 | Boler et al. | 357/30 |
| 4,343,014 | 8/1982 | Jaecklin | 357/30 |
| 4,355,320 | 10/1982 | Tihanyi | 357/30 |

Primary Examiner—Andrew J. James
Assistant Examiner—J. Carroll
Attorney, Agent, or Firm—Herbert L. Lerner; Laurence A. Greenberg

[57] ABSTRACT

Photo transistor, including a semiconductor body having a surface, a region placed on the surface of the body being intended for light exposure having an edge and a remainder of the region, a collector zone placed in the body and having at least a part thereof emerging to the surface of the body, a base zone being embedded in a planar manner in the collector zone and having at least a part thereof emerging to the surface of the body, an emitter zone being embedded in a planar manner in the base zone, an emitter electrode disposed on the emitter zone, an insulating layer covering the region intended for exposure, an auxiliary zone being embedded in the surface of the body and having a conductivity type being opposite to that of the collector zone, an auxiliary electrode being placed on the insulating layer and overlapping at least the part of the base zone emerging to the surface and the auxiliary zone and covering the part of the collector zone emerging to the surface, the insulating layer having a relatively thicker part and a relatively thinner part both being placed under the auxiliary electrode, the thicker part being placed over the edge of the region intended for exposure and overlapping the auxiliary zone and the thinner part being placed over the remainder of the region intended for exposure.

4 Claims, 3 Drawing Figures

PHOTO TRANSISTOR

This is a continuation application of patent application, Ser. No. 06/315,293, filed Oct. 27, 1981, now abandoned.

The invention relates to a photo transistor with a semiconductor body which has on one surface thereof a region intended for exposure, a collector zone into which a base zone is embedded in a planar manner, an emitter zone which is embedded in a planar manner in the base zone, an emitter electrode, an insulating layer which covers the region intended for exposure, an auxiliary zone embedded in the surface having a conductivity or conduction type opposite that of the collector zone, and with a transparent auxiliary electrode deposited on the insulating layer, which overlaps at least a part of the base zone emerging to the surface and the auxiliary zone, and which covers a part of the collector zone emerging to the surface.

It is accordingly an object of the invention to provide a photo transistor which overcomes the heretofore-present disadvantages of inadequate shielding effect of the heretofore-known devices of this general type, and to do so in such a way that a similarly good or even better shielding effect will also then be achieved by the transparent auxiliary electrode even if the active area of the photo transistor is small as compared to the area of the emitter and base zone.

With the foregoing and other objects in view there is provided, in accordance with the invention, a photo transistor, comprising a semiconductor body having a surface, a region disposed on the surface of the body being intended for exposure having an edge and a remainder of the region, a collector zone disposed in the body and having at least a part thereof emerging to the surface of the body, a base zone being embedded in a planar manner in the collector zone and having at least a part thereof emerging to the surface of the body, an emitter zone being embedded in a planar manner in the base zone, an emitter electrode disposed on the emitter zone, an insulating layer covering the region intended for exposure, an auxiliary zone being embedded in the surface of the body and having a conductivity type being opposite to that of the collector zone, an auxiliary electrode transparent to light being disposed on the insulating layer and overlapping at least the part of the base zone emerging to the surface and the auxiliary zone and covering the part of the collector zone emerging to the surface, the insulating layer having a relatively thicker part and a relatively thinner part both being disposed under the auxiliary electrode, the thicker part being disposed over the edge of the region intended for exposure and overlapping the auxiliary zone and the thinner part being disposed over the remainder of the region intended for exposure.

In accordance with another feature of the invention, at least the part of the auxiliary electrode disposed over the thinner part of the insulating layer, is formed of polysilicon.

In accordance with a further feature of the invention, the base zone has an edge, the emitter zone and base zone are wider than the emitter electrode, and the emitter electrode is in contact with the edge of the base zone.

In accordance with a concomitant feature of the invention, the area of the region intended for exposure is 300 to 800 times as large as the area of the base zone.

Other features which are considered as characteristic for the invention are set forth in the appended claims.

Although the invention is illustrated and described herein as embodied in a photo transistor, it is nevertheless not intended to be limited to the details shown, since various modifications and structural changes may be made therein without departing from the spirit of the invention and within the scope and range of equivalents of the claims.

Figure 2:
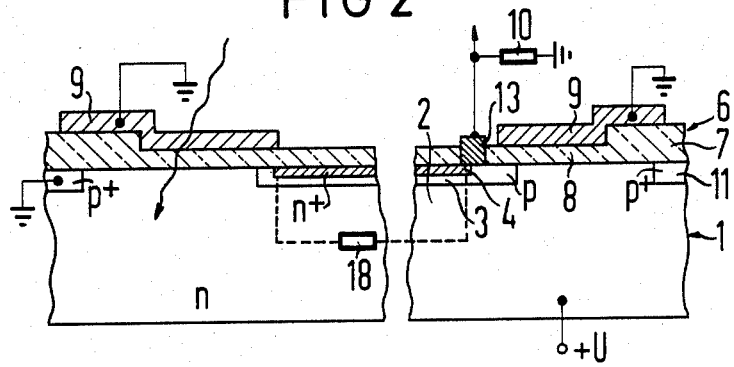
Figure 3:
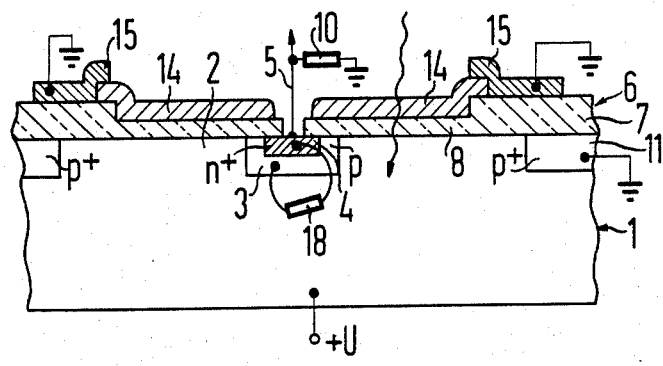

The construction and method of operation of the invention, however, together with additional objects and advantages thereof will be best understood from the following description of specific embodiments when read in connection with the accompanying drawings, in which:

FIG. 1 is a fragmentary, diagrammatic, cross-sectional view of an embodiment of the photo transistor of the invention; and FIGS. 2 and 3 are views similar to FIG. 1 of other embodiments of the invention.

In the following description, as an example, the collector zone has n-conductivity, the base zone p-conductivity and the emitter zone n-conductivity but the opposite (complementary) polarities can also be used.

In photo transistors the auxiliary electrode covers the part of the base zone and the collector zone emerging to the surface, and overlaps the auxiliary zone. If a positive voltage is applied to the auxiliary electrode, the space charge zone created thereby is deformed when the emitter-electrode voltage is applied. As a result equipotential surfaces are formed that adjust themselves accordingly, and due to the presence of the auxiliary electrode carriers generated in the space charge zone are forced toward the p-base zone of the photo transistor. On the other hand, this shape of the space charge zone prevents carriers generated outside the photo transistor, for instance, in other functional structures of an integrated circuit, from flowing to the base zone of the photo transistor.

Referring now to the figures of the drawing in which like parts with similar functions are provided with the same reference symbols, and first particularly to FIG. 1 thereof, it is seen that a semiconductor body 1 of a photo transistor is shown in cross section. The semiconductor body 1 has a collector zone 2 into which a base zone 3 is embedded in a planar manner. An emitter zone 4 is embedded in a planar manner in the base zone 3. All three zones therefore emerge to the surface of the semiconductor body 1. The above-mentioned zones have as stated above the zone sequence npn+, for example. The emitter zone 4 is connected by an emitter electrode which is not specifically designated in the drawing, to a terminal 5 which represents the output of the photo transistor. The output 5 is connected to ground potential through a resistor 10. An auxiliary zone 11 which has the conductivity or conduction type opposite to that of the collector zone 2, e.g. p-conductivity is furthermore embedded into the surface of the semiconductor body. The zone 11 may be tied to ground potential or biased several volts negative. The surface of the semiconductor body 1 is covered by an insulating layer 6, which is formed, for instance, of silicon dioxide $SiO_2$. This insulating layer has a thinner part 8 and a thicker part 7. The thicker part 7 overlaps the auxiliary zone 11. The thickness $d_1$ of the thinner part 8 may be 50 to 300 nm, and the thickness $d_2$ of the thicker part 7 may be 800 to 1500 nm. The surface dimension of the thinner part 8 agrees approximately with the dimension of a region 16 which is intended for light exposure. The edge of the region intended for the exposure is formed by the thicker part 7 of the insulating layer 6. On the thicker part 7 and the thinner part 8 of the insulating layer 6, there is disposed a transparent auxiliary electrode 9 which is formed, for instance, of n-doped polycrystalline silicon. This auxiliary electrode may be at an auxiliary voltage or at ground potential.

If positive potential is applied to the collector, then a space charge zone is formed between the surface of the semiconductor body and the collector zone or between the pn-junction disposed between the zones 2 and 3 and the collector zone and may partially penetrate the collector zone. The boundary of the space charge zone is designated with reference numeral 12. The boundary 12 of the space charge zone approximately follows the shape of the auxiliary electrode 9 from the outside in. Approximately in the region of the transition from the thickness $d_2$ to the thickness $d_1$, the width of the space charge zone is at a minimum. The space charge zone 12 is located at the largest distance from the surface, under the base zone 3. Due to the shape of the space charge zone, the equi-potential line 17 adjusts itself to a similar shape.

If light is radiated on the area intended for the exposure with energy $h.\mu$, charge carrier pairs are generated in the space charge zone 12. The positive charge carriers initially flow to the surface of the semiconductor body and then flow laterally to the base zone 3. This prevents the charge carriers generated by the incidence of the light from flowing off to other functional structures and not arriving at the base zone 3. Charge carriers generated in other functional units outside of the photo transistor are likewise prevented from flowing to the base zone 3.

In the photo transistor described herein, the area of the base zone 3 can be small as compared to the area of the region 16 intended for exposure, since the charge carriers generated near the edge of the region 16 also flow to the base zone 3 in the lateral direction. Such a construction can be used to advantage for driving power MOS components since the base-collector capacity of the photo transistor can be kept small by the small base zone area. This is because this capacity is connected in parallel with that of the input capacities of the power MOS component and must be small in the interest of a good switching behavior of the MOS component. It has been found, for example, to be useful to provide a lateral dimension c of the base zone 3 of 10 to 40 $\mu$m as compared to a lateral dimension b of the collector zone of 200 to 1000 $\mu$m. The lateral dimension a of the thicker part 7 of the insulating layer 6 may be between 10 and 50 $\mu$m.

Another embodiment example is shown in FIG. 2 which differs from that according to FIG. 1 by the provision that an emitter electrode 13 is placed on the side of a relative wide emitter zone. At the same time, the electrode 13 also makes contact with the edge of the base zone 3.

The p-base is likewise relatively wide and forms a resistance which is shown symbolically and is designated with reference numeral 18. This resistance is advantageous if the photo transistor is used in components operated at higher blocking voltages.

The embodiment example according to FIG. 3 shows an auxiliary electrode which is modified as compared to the embodiment examples according to FIGS. 1 and 2. The auxiliary electrode includes two parts 14, 15, the part 14 lying above the thinner part 8 of the insulating layer 6 and part 15 above the thicker part 7. The part 15 in this embodiment is formed of a metal such as aluminum, while the part 14 is formed of doped polysilicon because of its transparency to light. The auxiliary electrode parts are electrically connected to each other by the provision that a part 14 extends beyond the step of the layer 6 and makes contact at that location with the metal part. For higher blocking voltages, the resistor 18 may further be inserted between the emitter zone 4 and the base zone 3, as in FIG. 2. The resistor is only shown symbolically in FIG. 3.

We claim:

1. Photo transistor, comprising a semiconductor body having a surface, a collector zone disposed in said body and having at least a part thereof emerging to the surface of said body, the collector zone being of a first conductivity type and being connectable to a potential, a base zone being embedded in a planar manner in said collector zone and having at least a part thereof emerging to the surface of said body and being of a second conductivity type, an emitter zone being embedded in a planar manner in said base zone and being of the first conductivity type, an emitter electrode disposed on said emitter zone, a region disposed on the surface of said body being intended for exposure having an edge and a remainder of said region, the region comprising the emitter zone, said part of the base zone emerging to the surface of said body and a part of the collector zone, an insulating layer covering said surface, an auxiliary zone being embedded in the surface of said body and having the second conductivity type and being connectable to a potential, an auxiliary electrode being connectable to a potential and being transparent to light and being disposed on said insulating layer and overlapping at least said part of said base zone emerging to the surface and said auxiliary zone and covering said part of said collector zone emerging to the surface, said insulating layer having a relatively thicker part and a relatively thinner part both being disposed under said auxiliary electrode, said thicker part being disposed over the edge of said region intended for exposure and overlapping said auxiliary zone and said thinner part being disposed over the remainder of said region intended for exposure.

2. Photo transistor according to claim 1, wherein at least the part of the auxiliary electrode disposed over said thinner part of said insulating layer, is formed of polysilicon.

3. Photo transistor according to claim 1 or 2, wherein said base zone has an edge, said emitter zone and said base zone are wider than said emitter electrode, and said emitter electrode is in contact with the edge of said base zone.

4. Photo transistor according to claim 1, wherein the area of said region intended for exposure is 300 to 800 times as large as the area of said base zone.

* * * * *